(12) United States Patent
Kimizuka et al.

(10) Patent No.: US 7,102,183 B2
(45) Date of Patent: Sep. 5, 2006

(54) MOS TRANSISTOR

(75) Inventors: Naohiko Kimizuka, Kanagawa (JP); Kiyotaka Imai, Kanagawa (JP); Yuri Masuoka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/001,310

(22) Filed: Dec. 2, 2004

(65) Prior Publication Data
US 2005/0224857 A1   Oct. 13, 2005

(30) Foreign Application Priority Data
Mar. 31, 2004   (JP) .............................. 2004-107809

(51) Int. Cl.
*H01L 29/78*   (2006.01)
*H01L 27/108*   (2006.01)
*H01L 21/336*   (2006.01)

(52) U.S. Cl. ................. 257/288; 257/310; 438/197
(58) Field of Classification Search ............... 257/288, 257/310
See application file for complete search history.

(56) References Cited

U.S. PATENT DOCUMENTS 5,374,836 A * 12/1994 Vinal et al. .................. 257/344
5,698,884 A * 12/1997 Dennen ........................ 257/345
5,952,701 A *  9/1999 Bulucea et al. .............. 257/407
6,448,192 B1 * 9/2002 Kaushik ....................... 438/785

FOREIGN PATENT DOCUMENTS

JP   2003-289140   10/2003

OTHER PUBLICATIONS

"Fermi Level Pinning at the Polysi/Metal Oxide Interface", C. Hobbs et al., 2003 Syposium on VLSI Technology Digest of Technical Papers, 4-89114-035-6/03.

* cited by examiner

*Primary Examiner*—David Nelms
*Assistant Examiner*—Long Tran
(74) *Attorney, Agent, or Firm*—Young & Thompson

(57) ABSTRACT

In P-channel MOS transistor comprising a gate insulating film composed of a high dielectric constant material and the gate electrode composed of polycrystalline silicon, a technology for preventing Fermi level pinning and providing a stable reduction of the threshold voltage is provided. The MOS transistor functions as a buried channel transistor formed by implanting In as a P-type impurity into the channel region. In addition, the gate electrode is composed of the polycrystalline silicon film, which is doped with N-type impurity. Thus, the gate depletion caused by Fermi level pinning can be effectively inhibited. Therefore the depletion in the gate electrode can be avoided and the threshold voltage can be stably diminished. In this case, the threshold voltage is stably reduced since electric charge is induced by applying a constant voltage to the gate electrode.

20 Claims, 4 Drawing Sheets

MOS TRANSISTOR

This application is based on Japanese patent application NO. 2004-107809, the content of which is incorporated hereinto by reference.

BACKGROUND OF THE INVENTION

1. Field of the Invention

The present invention relates to a MOS transistor, which comprises a gate insulating film including a high dielectric constant film and a gate electrode comprising polycrystalline silicon.

2. Related Art

In recent years, the utilization of a thin film having high dielectric constant called high-k as a component material for the semiconductor devices is actively investigated. Typical high-k material includes oxides of elements such as Zr, Hf and the like. The use of such type of materials for a gate insulating film of a metal oxide semiconductor field effect transistor (MOSFET) reduces a silicon oxide equivarent thickness of the gate insulating film, even though the thickness of the gate insulating film is increased to a certain level, thereby providing a physically and structurally stable gate insulating film.

Japanese Patent Laid-Open No. JP-A-2003-289,140 discloses a MOSFET employing such high-k material. A N channel MOSFET of a surface-channel type is described in this disclosure. A metal silicate film is employed as a gate insulating film. A gate electrode is composed of N-type polycrystalline silicon.

However, a comprehension is obtained according to the recent study, in which a phenomenon called Fermi level pinning is caused when the gate insulating film is composed of a high-k film and the gate electrode is composed of polycrystalline silicon. (C. Hobbs et. al, entitled "Fermi Level Pinning at the PolySi/Metal Oxide Interface", 2003 Symposium on VLSI Technology Digest of Technical Papers) It is considered that Fermi level pinning is caused when an energy level is created on the basis of chemical bonding of silicon with the above-described metal composing the high-k film within polycrystalline silicon composing the gate, in vicinity of an interface of the gate insulating film in the gate electrode. The disclosure of this literature also describes that Fermi level pinning is caused when high-k films such as $HfO_2$ or $Al_2O_3$ is provided so as to contact polycrystalline silicon.

When Fermi level pinning is caused in gate polycrystalline silicon of the MOSFET, a depletion layer is created in the gate polycrystalline silicon in vicinity of an interface thereof with the gate insulating film. In such condition, sufficient voltage cannot be supplied to the gate insulating film, even though sufficient gate voltage is applied, and thus it is difficult to induce enough amount of carrier in the channel region. As a result, a problem is arisen, in which a threshold voltage is increased, and further a fluctuation in the threshold voltage is also increased. In particular, such phenomenon considerably appears in the P-channel MOS transistor, which comprises the gate electrode including gate polycrystalline silicon that contains P-type impurity.

SUMMARY OF THE INVENTION

The present invention has recognized in view of such circumstances, and a need exists in the art for avoiding a gate depletion caused by Fermi level pinning, thereby stably reducing the threshold voltage in a P-channel MOS transistor comprising a gate electrode including polycrystalline silicon.

According to the present invention, there is provided a MOS transistor, comprising: a semiconductor substrate region having N-type conductivity type; a first diffusion layer having P-type conductivity type, being provided in the semiconductor substrate region; a second diffusion layer having P-type conductivity type, being provided in the semiconductor substrate region; a channel region, being provided between the first diffusion layer and the second diffusion layer in an interior of the semiconductor substrate region; a gate insulating film, comprising a high dielectric constant film having higher dielectric constant than silicon oxide and being provided on the channel region; and a gate electrode, comprising polycrystalline silicon containing N-type impurity and being provided on the gate insulating film.

In the transistor according to the present invention, the polycrystalline silicon gate electrode, which is formed on the gate insulating film containing a high dielectric constant film, contains N-type impurity. Therefore, a depletion of the gate caused by Fermi level pinning can effectively be inhibited.

According to the present invention, since the polycrystalline silicon gate electrode, which is formed on the gate insulating film containing a high dielectric constant film, contains N-type impurity, a depletion of the gate caused by Fermi level pinning can effectively be inhibited.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed. The embodiments of the present invention will be described in reference with the annexed figures as follows. In all figures, identical numeral is assigned to similar element, and the detailed description thereof is appropriately omitted.

First Embodiment

Figure 1:
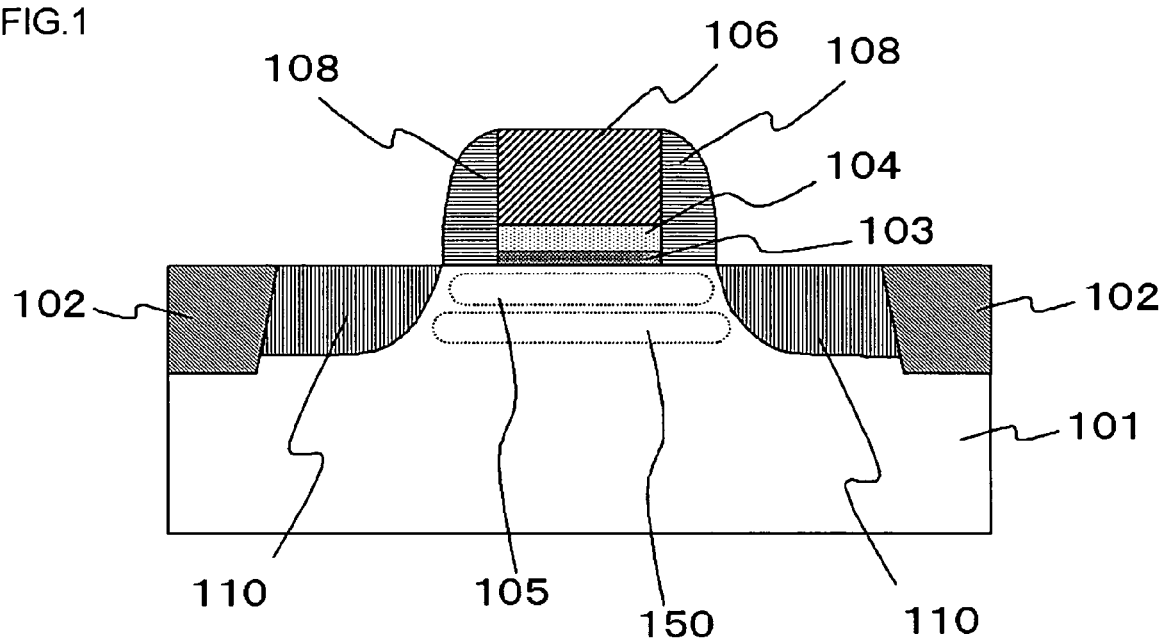
FIG. 1 is a schematic cross-sectional view of the transistor according to an embodiment of the present invention.

FIG. 1 is a schematic cross-sectional view of the transistor, showing an example of a MOS transistor 100 according to the present embodiment. This MOSFET has a buried-channel type structure. A pair of impurity diffusion regions 110 in a N-well 101 as a semiconductor substrate region having conductivity type of N-type provided on a silicon substrate (not shown in the drawings), and a channel region 105 is formed therebetween. A punchthrough stopper region 150, which provides a N-type impurity region, is formed across a source region and a drain region, both of which composes the impurity diffusion regions 110, under the channel region 105. In addition, a gate insulating film, which has a structure comprising a silicon thermal oxide film 103 and a high dielectric constant film 104 deposited in this sequence, is provided on the channel region 105 so as to contact an upper surface of the channel region 105, and further polycrystalline silicon film 106 is formed thereon so as to contact the upper surface of the gate insulating film, thereby providing a gate electrode.

The N well 101 can be formed by ion-implanting phosphorus at a condition of, for example, at an implanting energy of 150 KeV and with a dopant concentration of $1 \times 10^{13}$ cm$^{-2}$ to $5 \times 10^{13}$ cm$^{-2}$, and thereafter thermally processing thereof within a non-oxidizing atmosphere to activate the N-type impurity.

The silicon thermal oxide film 103 is formed by thermally oxidizing the surface of the N well 101. Film thickness thereof may be, for example, 1.2 nm.

The high dielectric constant film 104 is a film having higher specific dielectric constant than silicon oxide, and preferably has a specific dielectric constant of equal to or higher than 10. So-called high-k film can be employed. Preferable example of the high dielectric constant film 104 may be a film containing one or more element(s) selected from the group consisting of Hf, Zr, Al, La and Y, and an oxide film, a silicate film or the like containing any of these elements are preferably employed. Since the oxide film or the like containing the above-described metallic elements has higher specific dielectric constant and better heat resistance, such type of the oxide film contributes the size scale reduction and enhancement in the reliability of the MOS-FET. Although these advantageous effects can be obtained when such material is employed, the gate depletion caused by Fermi level pinning may be a problem. According to the configuration described in the present embodiment, such problems can be effectively solved, and the advantageous effect obtainable by employing the high dielectric constant film containing the above-described element can fully be achieved.

In addition, the high dielectric constant film 104 may be annealed within an atmosphere of a nitrogen-containing compound such as nitrogen, ammonia and the like to introduce nitrogen into the film. The crystallization of the high dielectric constant film 104 is inhibited by conducting the nitrogen annealing. As described later in the description on the manufacturing process, hafnium silicate is employed for the high dielectric constant film 104 in the present embodiment.

In the present embodiment, a multi-layered film of the above-described silicon thermal oxide film of silicon 103 and the high dielectric constant film 104 functions as a gate insulating film.

The channel region 105 is formed by ion-implanting a P-type impurity such as In and the like into the surface of the N well 101. As such, an increase of the threshold voltage is inhibited, since the channel region 105 is doped with the P-type impurity.

The punchthrough stopper region 150 is formed under the channel region 105 by ion-implanting a N-type impurity such as As and the like into the N well 101. Since the punchthrough stopper region 150 is formed under the channel region 105, the short-channel effect can be inhibited.

The polycrystalline silicon film 106 consists essentially of polycrystalline silicon doped with a N-type impurity such as As and the like, and substantially functions as a gate electrode. The depletion of the gate by Fermi level pinning can effectively be inhibited by employing polycrystalline silicon film doped with a N-type dopant.

The impurity diffusion region 110 is a diffusion layer, having the doped surface of the N well 101 with a P-type impurity that is introduced from the surface into a shallow region thereof. One will be a source region, and the other will be a drain region.

Figure 2A:
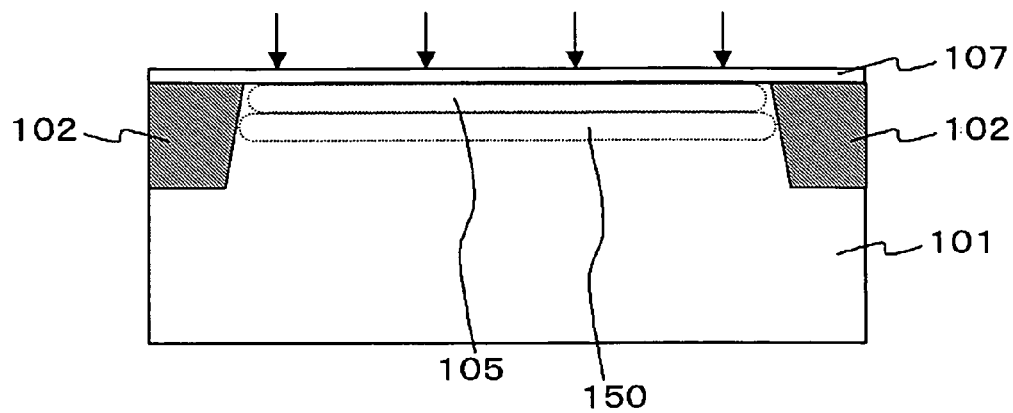
FIGS. 2A to 2C are schematic cross-sectional views, showing a method of manufacturing the transistor according to an embodiment of the present invention.

A process for manufacturing MOS transistor 100 shown in FIG. 1 will be described as follows. First, for example, a device isolation region 102 is formed on a silicon substrate having a principal surface of the [100] crystal plane by shallow trench isolation (STI), and thereafter a N-type impurity such as As and the like is ion-implanted to form the N well 101, as shown in FIG. 2A. The device isolation may be conducted by employing other known process for providing the device isolation, and, for example, the device isolation may be conducted by local oxidation of silicon (LOCOS) process.

Subsequently, a sacrificial oxide film 107 is formed onto the surface of the silicon substrate. The sacrificial oxide film 107 can be obtained by oxidizing the surface of the N well 101 via a thermal processing. The process conditions for the thermal processing may be, for example, at a processing temperature of 900 degree C., and for a disposition duration time of from about 40 to 50 seconds.

Then, a N-type impurity such as As and the like, for example, is ion-implanted from the top of the sacrificial oxide film 107. A punchthrough stopper region 150 is formed by such ion implantation, and the formed region provides an inhibition of a deterioration of the short-channel characteristics. The ion implantation condition for forming the punchthrough stopper region 150 may be, for example, at an energy of 150 keV and with a concentration of $5 \times 10^{12}$ cm$^{-2}$.

Subsequently, a P-type impurity such as In and the like, for example, is ion-implanted to form the channel region 105 in vicinity of the outer surface of the N well 101. The condition for the ion implantation condition may be, for example, at an energy of 60 keV and with a concentration of $2 \times 10^{13}$ cm$^{-2}$ for the case of employing In.

Figure 2B:
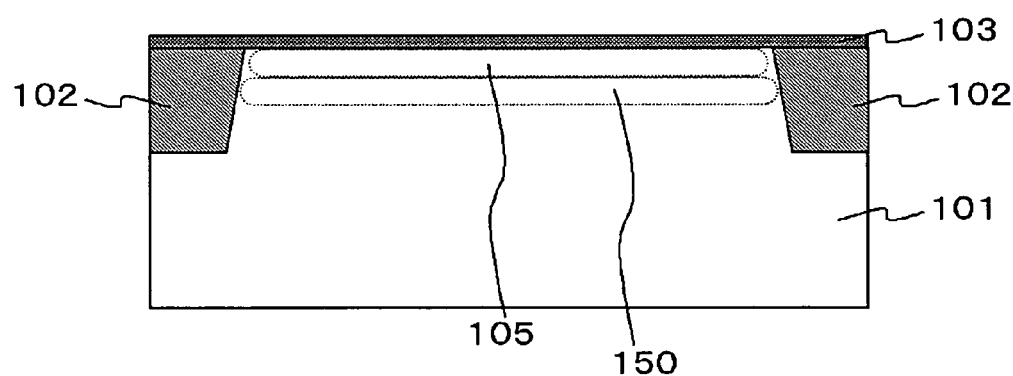

Then, as shown in FIG. 2B, the sacrificial oxide film 107 formed on the N well 101 is removed. More specifically, the sacrificial oxide film 107 is etched off by employing a diluted hydrofluoric acid (for example, HF:H$_2$O=1:200), and then the etched surface is cleaned with pure water and dried with nitrogen blow or the like.

Subsequently, the surface of the N well 101 is thermally oxidized to form a silicon thermal oxide film 103. The condition for the thermal oxidation may be, for example, at a processing temperature of 950 degree C., and for a disposition duration time of about 40 seconds. The film thickness of the silicon thermal oxide film 103 is set to, for example, about 1.5 nm.

Figure 2C:
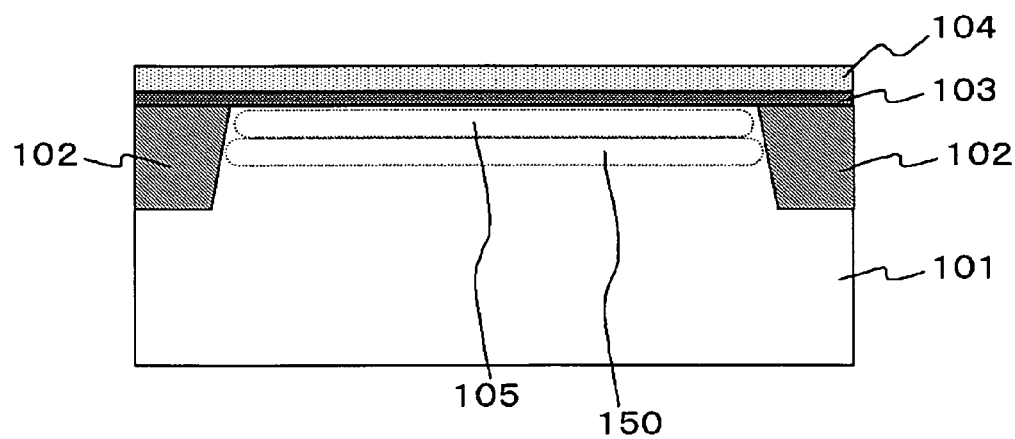

Then, as shown in FIG. 2C, a high dielectric constant film 104 is deposited on the silicon thermal oxide film 103. The high dielectric constant film 104 may be deposited via chemical vapor deposition (CVD), atomic layer deposition (ALD) or the like. In the present embodiment, a hafnium film is employed as the high dielectric constant film 104. This deposition is conducted by using a mixture of an organic hafnium reactant gas, an oxidizing gas and a silicon-containing gas. Here, oxygen or the like may be employed for the oxidizing gas, and mono-silane ($SiH_4$) or the like may be employed for the silicon-containing gas. The film thickness of the high dielectric constant film 104 is set to about 1.5 nm. After depositing the silicon thermal oxide film 103 and the high dielectric constant film 104, a nitrogen annealing thereof is carried out. The nitrogen annealing process is carried out by using a nitrogen-containing compound such as nitrogen, ammonia and the like, and the annealing conditions may be, for example, at a processing temperature of 850 to 1,000 degree C. and for a disposition duration time of about 40 seconds in the case of employing ammonia. The crystallization of hafnium silicate can be prevented by conducting the nitrogen annealing.

Figure 3A:
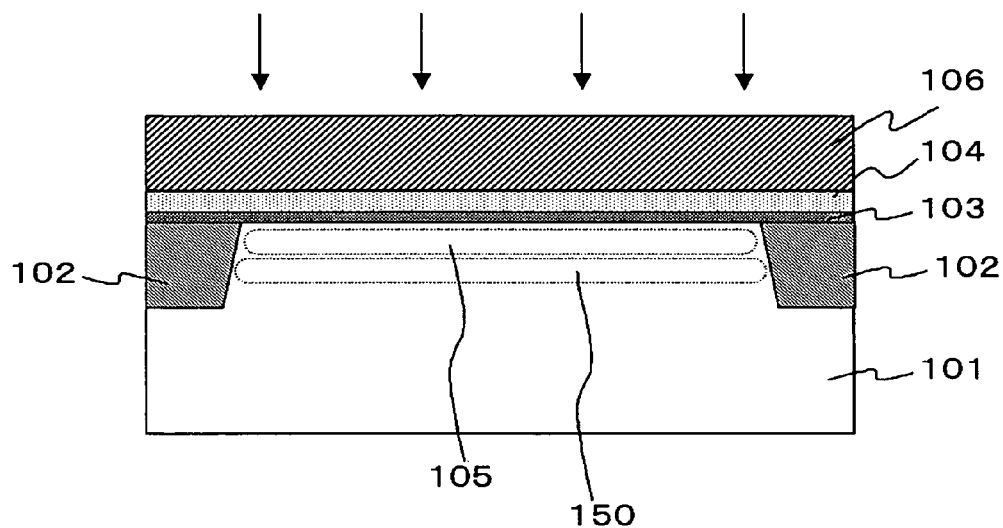
FIGS. 3A to 3C are schematic cross-sectional views, showing a method of manufacturing the transistor according to an embodiment of the present invention.
Figure 3B:
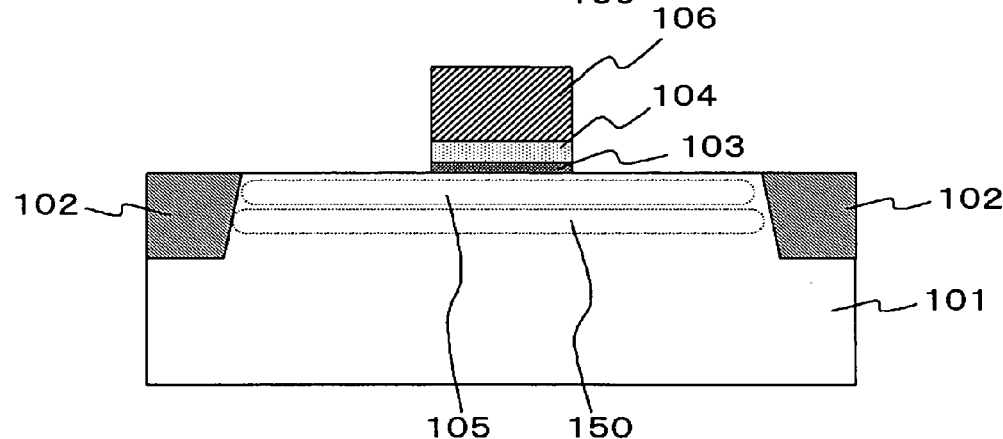

Next, as shown in FIG. 3A, a polycrystalline silicon film 106 is deposited on the high dielectric constant film 104, and then a N-type impurity is ion-implanted into the entire surface of the polycrystalline silicon film 106. The thickness of the polycrystalline silicon film 106 is set to, for example, about 130 nm. Here in the present embodiment, phosphorus is employed as the N-type impurity, and the ion-implantation thereof is conducted in a condition of at 10 keV and with $4\times10^{15}$ $cm^{-2}$. Thereafter, as shown in FIG. 3B, the silicon thermal oxide film 103, the high dielectric constant film 104 and the polycrystalline silicon film 106 are selectively dry etched to form a shape of a gate electrode. Alternatively, the process may employ another configuration, in which the silicon thermal oxide film 103 and the high dielectric constant film 104 remains on the entire surface.

Figure 3C:
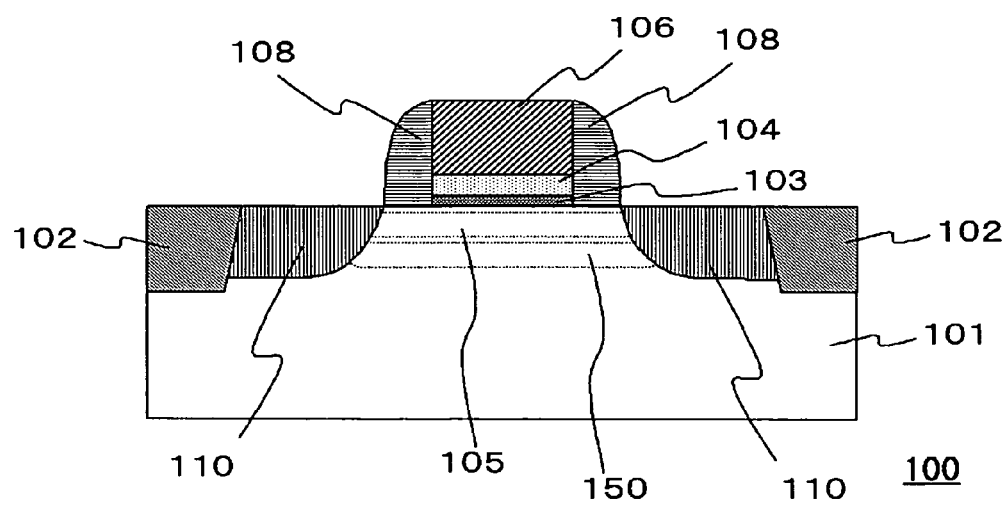

Next, in order to form a S/D extension (source/drain extension) region (not shown in the drawings), which is a portion for providing an electrical coupling of the channel region 105 with an impurity diffusion region 110 that will be described later, ion implantation with $BF_2$ is conducted in a condition of at 2.5 keV and with $5\times10^{14}$ $cm^{-2}$. Subsequently, as shown in FIG. 3C, side wall insulating films 108 are formed on the side walls of the gate electrode comprising the silicon thermal oxide film 103, the high dielectric constant film 104 and the polycrystalline silicon film 106. More specifically, an anisotropic etch is conducted by employing, for example, fluorocarbon gas or the like, so that the side wall insulating films 108 partially remains only on the side walls of the silicon thermal oxide film 103, the high dielectric constant film 104 and the polycrystalline silicon film 106. Then, a P-type impurity is doped within an outer layer of the N well 101 through the side wall insulating film 108 and the gate electrode as a mask to form an impurity diffusion region 110. Boron is employed for P-type impurity in this case. The implantation condition thereof is, for example, at 2 keV and with $5\times10^{14}$ $cm^{-2}$ to $2\times10^{15}$ $cm^{-2}$. Thereafter, a thermal processing is conducted within a non-oxidizing atmosphere to activate the doped impurity. The condition for the thermal processing is, for example, a spike annealing conducted at a temperature within a range of from 1,030 to 1,050 degree C. As such, the MOS transistor 100 is formed via the above-described manufacturing process.

The advantageous effects of the MOS transistor 100 will be described as follows.

In the present embodiment, the MOS transistor 100 functions as a buried channel transistor by implanting In as the P-type impurity into the channel region 105. In addition, the gate electrode is composed of the doped polycrystalline silicon film 106, which is doped with the N-type impurity. Thus, even if Fermi level pinning is occurred by the diffusion of hafnium, such configuration can effectively inhibit the gate depletion caused by this phenomenon. Therefore, the threshold voltage of the MOS transistor 100 can be stably reduced to achieve a control thereof at a level that provides an applicability thereof to the commercial products (threshold voltage of about 0.5V).

In addition, the punchthrough stopper region 150 is provided under the channel region 105 in the present embodiment. Such configuration provides inhibiting the short-channel effect. Although the short-channel effect is readily occurred in the MOS transistor 100 of the buried channel type as in the present embodiment, the problem can be solved by providing the punchthrough stopper region 150 thereto.

Second Embodiment

Figure 4A:
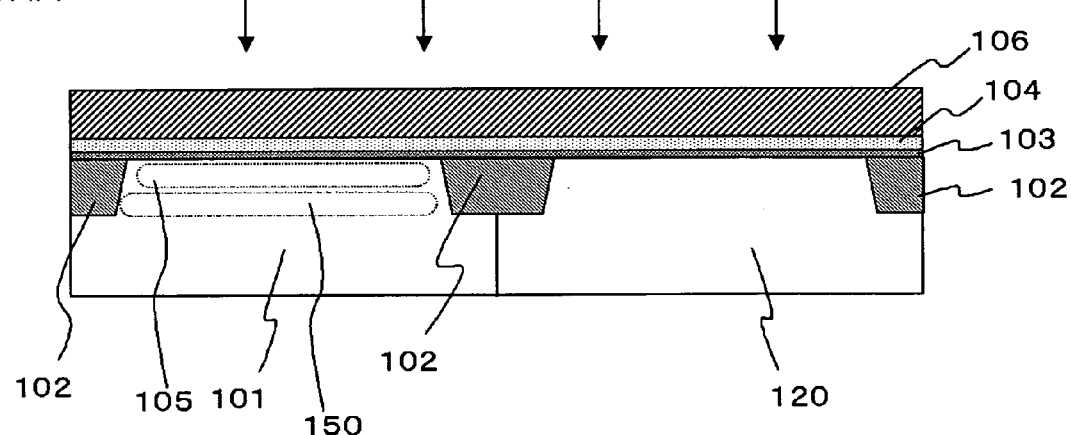
FIGS. 4A to 4C are schematic cross-sectional views, showing a method of manufacturing the transistor according to an embodiment of the present invention.
Figure 4B:
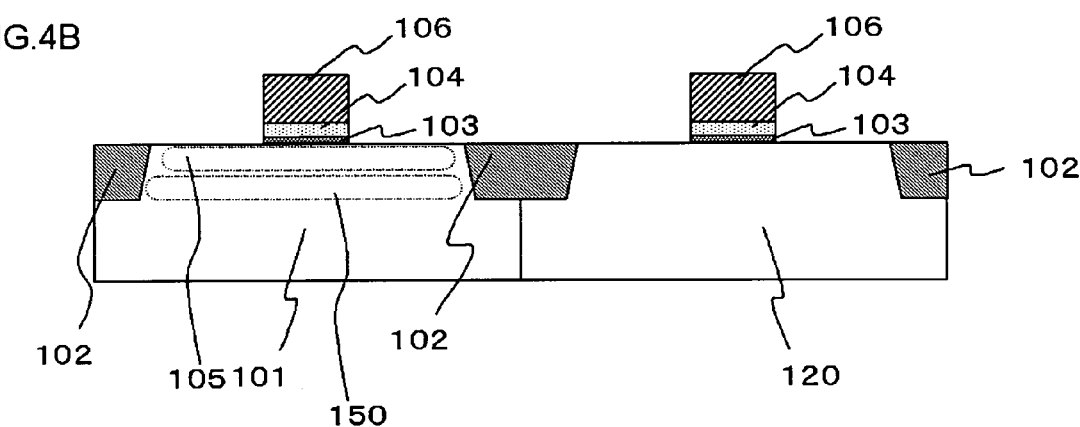
Figure 4C:
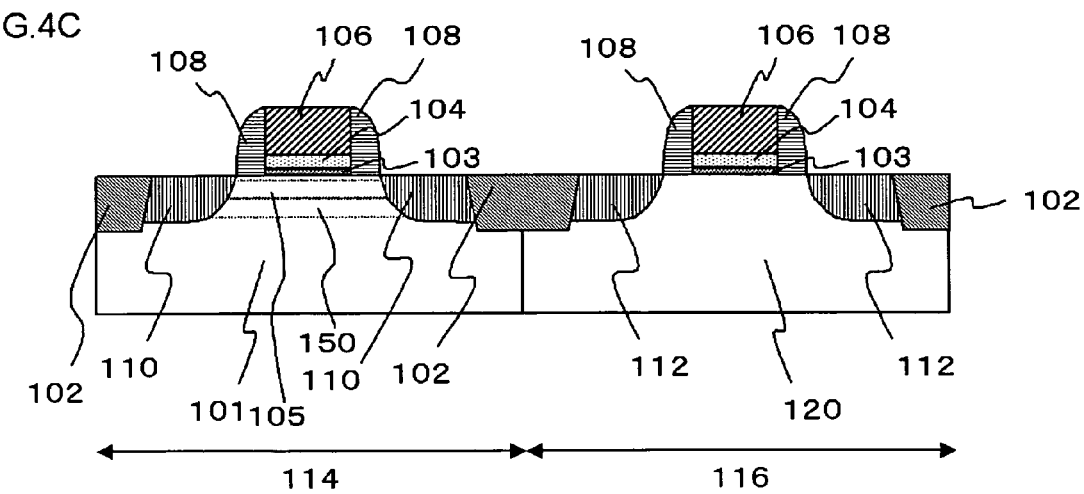

The present embodiment relates to an embodiment, in which the present invention is applied to a complementary metal oxide semiconductor (CMOS). FIGS. 4A to 4C are cross sectional views, showing a method of manufacturing the CMOS according to the present embodiment.

First of all, the structure shown in FIG. 4A is obtained as follows. First, a device isolation region 102 is formed in a silicon substrate, and then a N well 101 is formed in a P-channel MOS (PMOS) region, and a P well 120 is formed in a N-channel MOS (NMOS) region. Then, a silicon thermal oxide film 103, a high dielectric constant film 104 and a polycrystalline silicon film 106 are deposited on the surface of the substrate in this sequence. The deposition methods for these films are similar to that described in the first embodiment. Thereafter, N-type impurity is ion-implanted onto the entire surface of the polycrystalline silicon film 106. Here in the present embodiment, phosphorus is employed, and the ion-implantation thereof is conducted in a condition of at 10 keV and with $4\times10^{15}$ $cm^{-2}$.

Then, as shown in FIG. 4B, a patterned resist mask having a predetermined pattern is provided on the multi-layered film comprising the silicon thermal oxide film 103, the high dielectric constant film 104 and the polycrystalline silicon film 106, and the above-described multi-layered film is selectively dry etched to form a shape of a gate electrode. Here, similarly as in the first embodiment, this processing step may employ an alternative configuration of having the silicon thermal oxide film 103 and the high dielectric constant film 104 remaining on the entire surface.

Subsequently, as shown in FIG. 4C, for example, side wall insulating films 108 are formed on the side walls of the gate electrode comprising the silicon thermal oxide film 103, the high dielectric constant film 104 and the polycrystalline silicon film 106 by employing a similar manner as in the first embodiment. Then, a P-type impurity is doped into the P-channel MOS region through a mask of the gate electrode to form an impurity diffusion region 110. Then, a N-type impurity is also doped into the N-channel MOS region to form an impurity diffusion region 112. Boron, for example, is employed as the P-type impurity, and the ion-implantation thereof is conducted in a condition of at 2 keV and with about $5\times10^{14}$ $cm^{-2}$ to $2\times10^{15}$ $cm^{-2}$, and As, for example, is employed as the N-type impurity, and the ion-implantation thereof is conducted in a condition of at 30 keV and with about $3\times10^{15}$ $cm^{-2}$. As described above, the CMOS transistor comprising the P-channel MOS transistor 114 having the N well 101 and the N-channel MOS transistor 116 having the P well 120 is formed.

According to the present embodiment, after forming the polycrystalline silicon film 106, a N-type impurity such as phosphorus and the like can be implanted into the polycrystalline silicon film 106 of the P-channel MOS transistor 114 and the N-channel MOS transistor 116 by conducting a single lithography process. Thus, simplification of the manufacturing process can be achieved.

The present invention is described by illustrating the embodiments in reference with the annexed figures, and it should be understood that these disclosures are for the illustrations of the present invention only, and various other configurations than the above-described can also be employed.

For example, although the above embodiments are described on the configuration, in which the high dielectric constant film 104 is deposited via CVD process, other deposition method such as ALD process or the like may also employed.

In addition, although the above embodiments are described on the configuration, in which the hafnium silicate film is employed as the high-k film, a film of oxide, silicate, oxynitride or the like of Hf, Zr, Al, La, Y or the like, may also be employed. Here, it is reported by C. Hobbs et. al entitled "Fermi Level Pinning at the PolySi/Metal Oxide Interface" in 2003 Symposium on VLSI Technology Digest of Technical Papers, that Fermi level pinning is caused when the high-k film such as $HfO_2$ or $Al_2O_3$ is provided so as to contact polycrystalline silicon. It is considered, in addition to $HfO_2$ or $Al_2O_3$, that similar phenomenon may also be caused in the case of employing films of oxide, silicate, oxynitride or the like of Hf, Zr, Al, La, Y or the like, which have characteristics similar to that of $HfO_2$, $Al_2O_3$. Therefore, even though Fermi level pinning is caused by employing an above-described high-k film, the gate depletion problem can effectively be inhibited by having a configuration, in which the gate electrode is composed of the doped polycrystalline silicon film 106 with a N-type impurity. Therefore, the threshold voltage of the MOS transistor can be stably reduced to achieve a control thereof at a level that provides an applicability thereof to the commercial products.

In addition, although the configuration of forming the channel region 105 in vicinity of the outer layer of the N well 101 by ion-implanting In as the P-type impurity therein is described in the above-described embodiment, other P-type impurity such as boron may be implanted to form the channel region in vicinity of the outer layer of the N well. Having such configuration, an increase of the threshold voltage can be inhibited.

In addition, although the configuration of forming the punchthrough stopper region 150 by ion-implanting As as the N-type impurity therein is described in the above-described embodiment, other N-type impurity such as phosphorus and the like may be implanted to form the punchthrough stopper region. Having such configuration, a deterioration of the short-channel characteristics can be inhibited.

It is apparent that the present invention is not limited to the above embodiment, that may be modified and changed without departing from the scope and spirit of the invention.

What is claimed is:

1. A MOS transistor, comprising:
a semiconductor substrate region having N-type conductivity type;
a first diffusion layer having P-type conductivity type, being provided in said semiconductor substrate region;
a second diffusion layer having P-type conductivity type, being provided in said semiconductor substrate region;
a channel region, being provided between said first diffusion layer and said second diffusion layer in an interior of said semiconductor substrate region;
a gate insulating film, comprising a high dielectric constant film having higher dielectric constant than silicon oxide and being provided on said channel region; and
a gate electrode, comprising polycrystalline silicon containing N-type impurity and being provided on said gate insulating film, the gate electrode sufficiently doped with the N-type impurity to inhibit gate depletion in the presence of Fermi level pinning occurring by diffusion within the high dielectric constant film.

2. The MOS transistor according to claim 1, wherein said high dielectric constant film contains one or more element (s) selected from a group consisting of Hf, Zr, Al, La and Y.

3. The MOS transistor according to claim 1, wherein P-type impurity is introduced into said channel region.

4. The MOS transistor according to claim 1, further comprising a N-type impurity region under said channel region, said N-type impurity region containing N-type impurity introduced therein.

5. The MOS transistor according to claim 1, wherein said gate insulating film comprises a silicon oxide film and said high dielectric constant film provided thereon, and wherein said high dielectric constant film is in contact with said gate electrode.

6. The MOS transistor according to claim 1, wherein said high dielectric constant film contains one or more element(s) selected from a group consisting of hafnium oxide, zirconium oxide, aluminum oxide, lanthanum oxide, and yttrium oxide.

7. The MOS transistor according to claim 6, wherein the high dielectric constant film contains nitrogen from annealing within an atmosphere of a nitrogen-containing compound.

8. The MOS transistor according to claim 1, wherein said high dielectric constant film has a specific dielectric constant of equal to or higher than 10.

9. The MOS transistor according to claim 8, wherein the high dielectric constant film is hafnium silicate.

10. The MOS transistor according to claim 8, wherein the high dielectric constant film is non-crystallized hafnium silicate containing nitrogen.

11. The MOS transistor according to claim 10, wherein, the gate electrode is sufficiently doped with the N-type impurity so that even if Fermi level pinning occurs by diffusion of hafnium, gate depletion is inhibited.

12. The MOS transistor according to claim 8, wherein the high dielectric constant film is an oxynitride of one of the group consisting of Hf, Zr, Al, La, and Y.

13. The MOS transistor according to claim 8, wherein the high dielectric constant film is an oxynitride of one of the group consisting of Hf, Zr, Al, La, and Y.

14. The MOS transistor according to claim 1, wherein the high dielectric constant film is hafnium silicate.

15. The MOS transistor according to claim 1, wherein the high dielectric constant film is non-crystallized hafnium silicate containing nitrogen.

16. The MOS transistor according to claim 15, Wherein, the channel region comprised buried In, the MOS transistor functions as a buried channel transistor, the gate electrode is sufficiently doped with the N-type impurity so that even if Fermi level pinning occurs by diffusion of hafnium, gate depletion is inhibited.

17. The MOS transistor according to claim 16, further comprising:
a punchthrough stopper region provided adjacently below the channel region.

18. A MOS transistor, comprising:
a semiconductor substrate region having N-type conductivity type;
a first diffusion layer having P-type conductivity type, being provided in said semiconductor substrate region;
a second diffusion layer having P-type conductivity type, being provided in said semiconductor substrate region;
a channel region, being provided between said first diffusion layer and said second diffusion layer in an interior of said semiconductor substrate region;
a gate insulating film, provided on said channel region, comprising a silicon oxide gate insulating film adjacent a high dielectric constant film of hafnium having a higher dielectric constant than the silicon oxide; and
a gate electrode, comprising polycrystalline silicon containing N-type impurity and being provided adjacent the high dielectric film, the gate electrode sufficiently doped with the N-type impurity to inhibit gate depletion in the presence of Fermi level pinning occurring by diffusion of the hafnium within the high dielectric constant film.

19. The MOS transistor of claim 18, wherein, the high dielectric constant film comprises one of an oxide, a silicate, and an oxynitride of hafnium, and the silicon oxide film is approximately 1.2nm to 1.5 nm thick.

20. The MOS transistor of claim 18, wherein, the silicon oxide film is approximately 1.2nm to 1.5 nm thick.

* * * * *